United States Patent [19]
Turner

[11] Patent Number: 5,661,365
[45] Date of Patent: Aug. 26, 1997

[54] TELLURIUM LAMP

[75] Inventor: Brian Turner, Myersville, Md.

[73] Assignee: Fusion Lighting, Inc., Rockville, Md.

[21] Appl. No.: 324,149

[22] Filed: Oct. 17, 1994

Related U.S. Application Data

[63] Continuation-in-part of Ser. No. 136,078, Oct. 15, 1993, abandoned, and Ser. No. 60,556, May 13, 1993, abandoned, which is a continuation-in-part of Ser. No. 882,410, May 13, 1992, abandoned, which is a continuation-in-part of Ser. No. 779,718, Oct. 23, 1991, abandoned, which is a continuation-in-part of Ser. No. 604,487, Oct. 25, 1990, abandoned.

[51] Int. Cl.$^6$ ............... H01J 17/20; H01J 61/12; H01J 61/18
[52] U.S. Cl. ............... 313/637; 313/570; 313/571; 313/638; 313/639; 313/642
[58] Field of Search ............... 313/570, 571, 313/637, 638, 639, 642

[56] References Cited

U.S. PATENT DOCUMENTS

| | | |
|---|---|---|
| 3,234,421 | 2/1966 | Reiling . |
| 3,748,520 | 7/1973 | Silver . |
| 5,069,546 | 12/1991 | Liang et al. . |

FOREIGN PATENT DOCUMENTS

| | | |
|---|---|---|
| 52012791 | 1/1977 | Japan . |
| 55-10759 | 7/1978 | Japan . |
| 55095265 | 7/1980 | Japan . |
| 55010759 | 1/1983 | Japan . |

OTHER PUBLICATIONS

Abstract of Soviet Patent Publ. No. 705562-A, Dec. 30, 1979.

Search Abstract of "Study of the Near Ultraviolet Emission of Tellurium–Doped Xenon Flashlamps", Palmer R E; Palmer M A, Technical Report of Sandia Lab, 1979.

Abstract of 84JP-259960, Dec. 11, 1984.

*Primary Examiner*—Nimeshkumar Patel
*Attorney, Agent, or Firm*—Pollock, Vande Sande & Priddy

[57] ABSTRACT

A lamp for providing visible radiation includes tellurium or a tellurium compound in the fill. This substance is present in an amount such that when the fill is excited with sufficient power, substantially all of the radiation resulting from tellurium is emitted at wavelengths exceeding 400 nm. When tellurium is added to a sulfur or selenium based lamp for emitting visible radiation, the spectrum is shifted towards the red region.

14 Claims, 3 Drawing Sheets

TELLURIUM LAMP

The present application is a continuation-in-part of U.S. application Ser. No. 08/136,078, now abandoned, filed Oct. 15, 1993 and U.S. patent application Ser. No. 060,556, filed May 13, 1993, now abandoned, which is a continuation-in-part of U.S. application Ser. No. 882,410, filed May 13, 1992, now abandoned, which is a continuation in part of U.S. patent application Ser. No. 779,718, filed Oct. 23, 1991, now abandoned which is a continuation in part of U.S. patent application Ser. No. 604,487, now abandoned, filed Oct. 25, 1990.

The present invention is directed to a new lamp for providing visible radiation.

The incandescent and fluorescent lamps which are commonly used in homes and offices, do not provide enough illumination for many commercial and industrial applications. Insofar as residential use is concerned, the incandescent lamp is lacking in efficacy (visible light output power as compared with inputted electrical power) and is therefore expensive to operate, while the fluorescent lamp does not provide a continuous spectrum.

The lamp which has gained acceptance and which is typically used for high power illumination for commercial and industrial applications is known as the high intensity discharge (HID) lamp. The fill in the HID lamp usually contains mercury. However, this is undesirable because mercury is a highly toxic and volatile substance. Thus, if a HID lamp should break, dangerous mercury fumes would be emitted, and after the useful life of the lamp is over, there is no easy way to safely dispose of the mercury containing envelope. The widespread use of mercury containing lamps has been recognized as a serious environmental problem.

There are many ways to measure how good a lamp is, and amongst those skilled in the lamp art the use of various standardized performance indicators has arisen. These include the luminous efficacy of the lamp, its rated life, lumen maintenance, chromaticity, and color rendering index (CRI). Additionally, the stability of the color of the light which is emitted by the lamp is important, as this may change over time. The closer these accepted indicators are to ideal, the better the performance of the lamp.

In accordance with the present invention, a lamp is provided which has superior performance characteristics, and which is also capable of operating without the use of mercury.

In accordance with an aspect of the invention, a lamp is provided with a fill which includes a tellurium containing substance from which elemental tellurium can be obtained upon excitation, which is present in an amount such that when the fill is excited with sufficient power in operation, it emits visible radiation, with substantially all of the radiation resulting from the elemental tellurium being emitted at wavelengths longer than about 400 nm.

In accordance with a further aspect of the invention, a tellurium containing substance, is added to a sulfur or selenium based lamp for producing visible radiation. The effect of the tellurium is to shift the spectrum of the sulfur or selenium containing lamp towards the red region, thus providing light having a warmer quality and improved color rendition.

The lamps which are provided in accordance with the present invention, have relatively high efficacy, good color rendition, relatively long life and output a continuous spectrum. Such lamps may also have high lumen maintenance as well as stable color output over time. Lamps having such characteristics are considered to be desirable light sources for a variety of visible lighting applications.

While it is known to use each of the elements of the periodic table (including tellurium) as the fill for a lamp so as to generate the atomic and/or molecular spectrum of such elements, such spectroscopic reference lamps do not provide either enough light or the correct spectrum for use as visible illumination sources.

It is thus an advantage of the present invention to provide a visible light source having superior performance.

It is a further advantage of the present invention to provide a visible light source which is capable of operating without the use of mercury in the fill.

The invention will be better appreciated in accordance with the accompanying figures, wherein.

Figure 4:
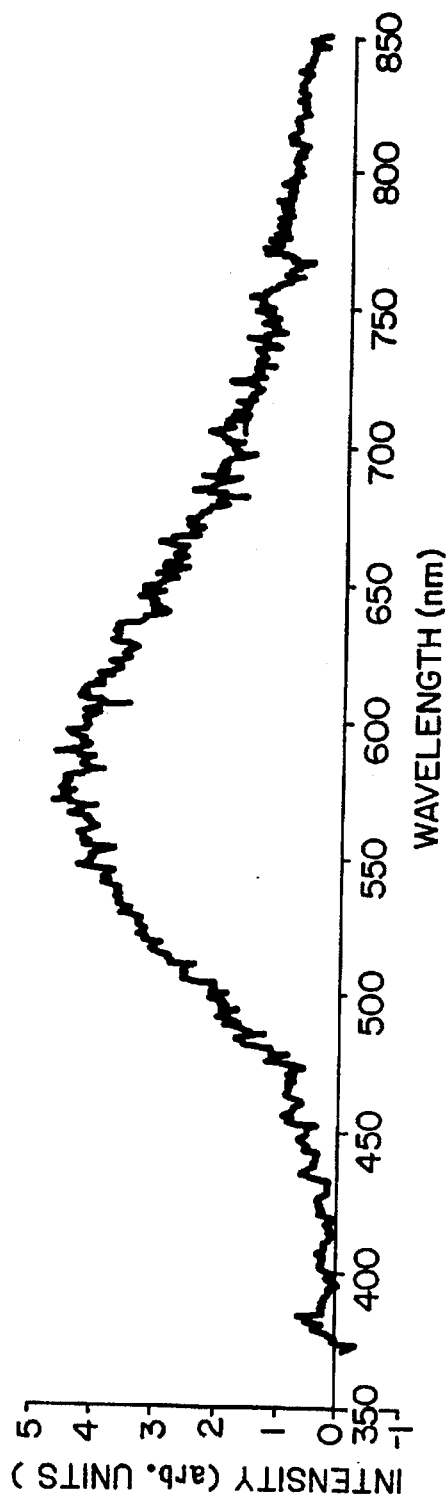

FIG. 4 a spectrum of emitted light for a tellurium lamp.

Figure 5:
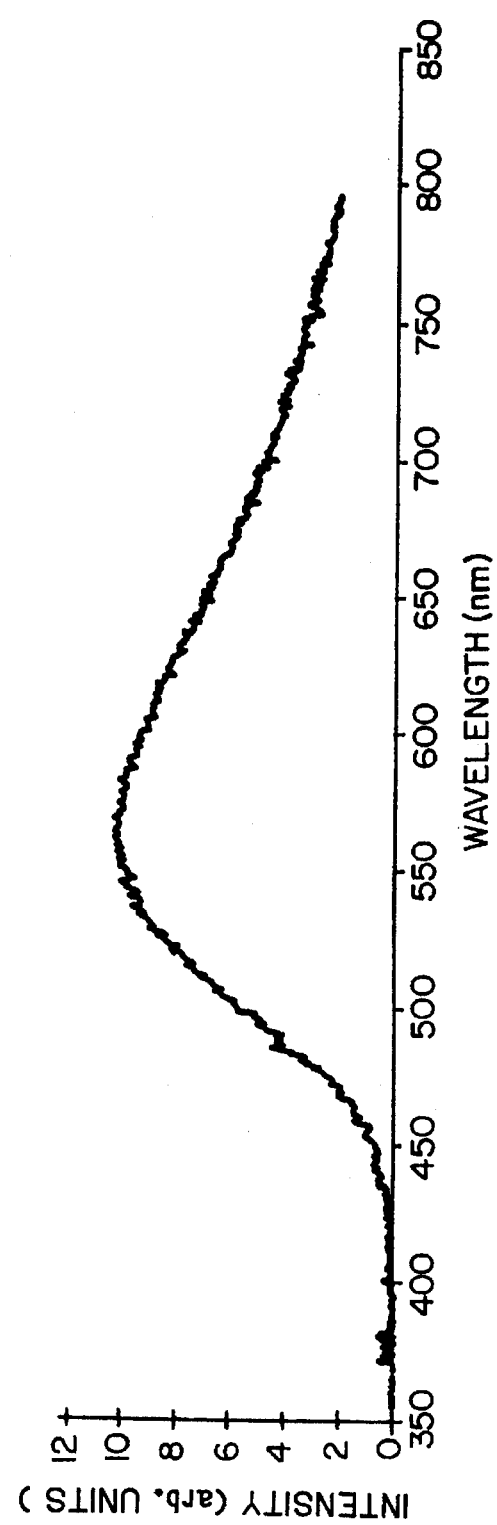

FIG. 5 is a spectrum of emitted light for a selenium lamp to which tellurium has been added.

Figure 6:
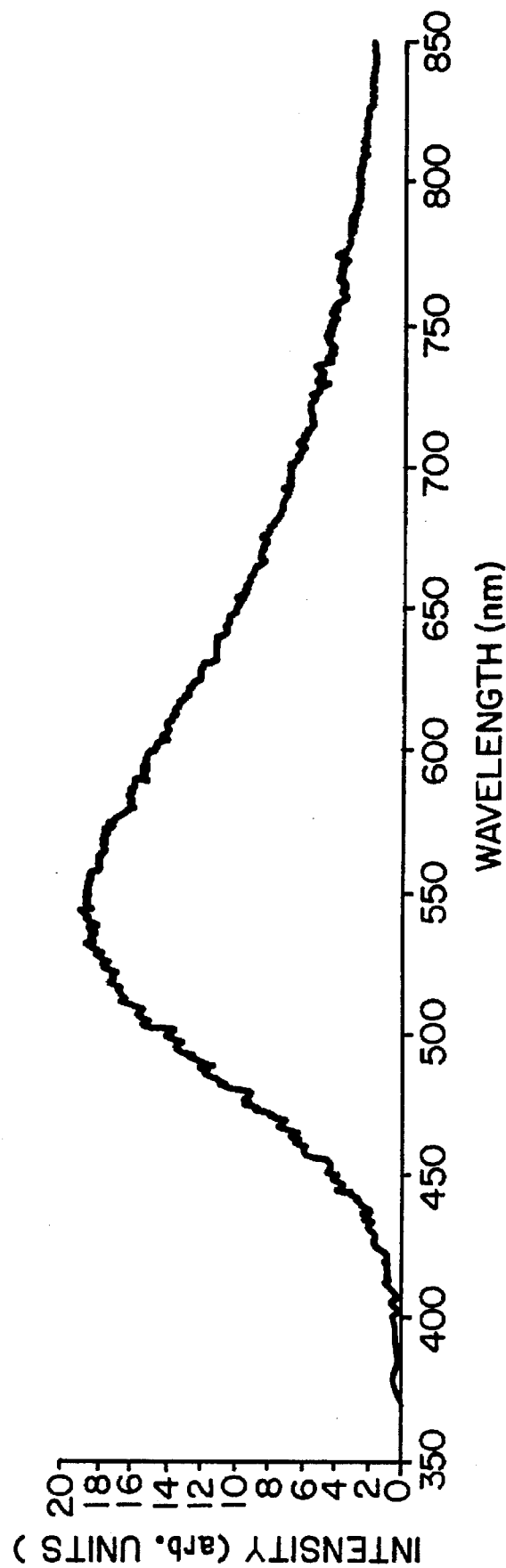

FIG. 6 is a spectrum of emitted light for a selenium lamp.

Figure 1:
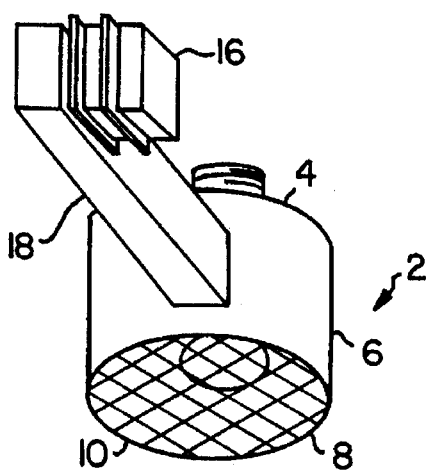
FIG. 1 is a perspective view of an embodiment of the invention.

Referring to FIG. 1, lamp 2 is depicted which is an embodiment of the invention which is powered by microwave energy, it being understood that R.F. energy may be used as well.

Lamp 2 includes a microwave cavity 4 which is comprised of metallic cylindrical member 6 and metallic mesh 8. Mesh 8 is effective to allow the light to escape from the cavity while retaining the microwave energy inside.

Figure 2:
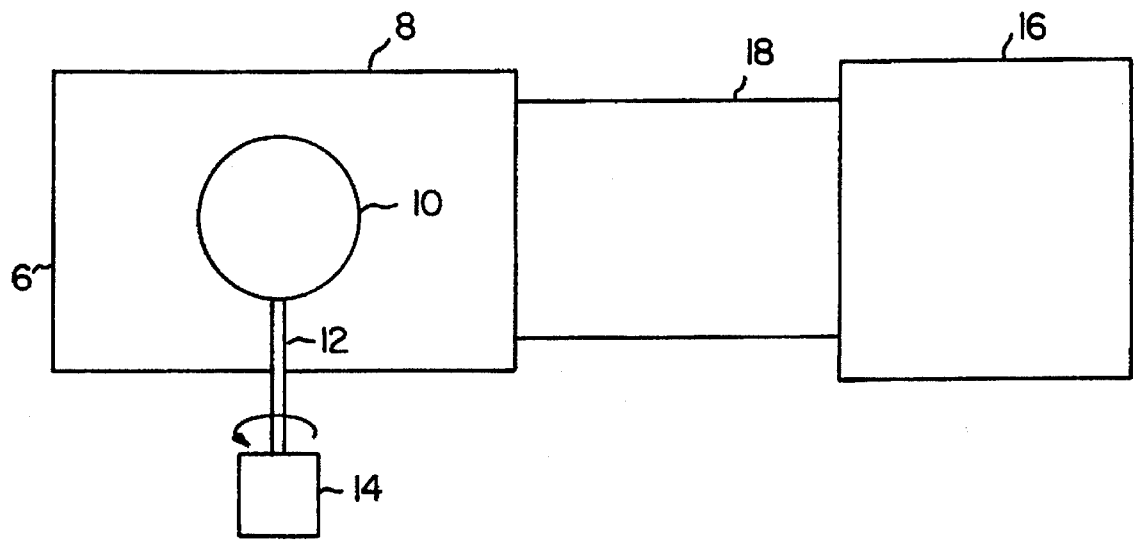
FIG. 2 is a side view of the embodiment of FIG. 1.

Bulb 10 is disposed in the cavity, which in the embodiment depicted is spherical. Referring to FIG. 2, the bulb is supported by stem 12, which is connected with motor 14 for effecting rotation of the bulb. This rotation promotes stable operation of the lamp.

Microwave energy is generated by magnetron 16, and waveguide 18 transmits such energy to a slot (not shown) in the cavity wall, from where it is coupled to the cavity and particularly to the fill in bulb 10.

Bulb 10 consists of a bulb envelope and a fill in the envelope. In accordance with an aspect of the invention, tellurium or a tellurium compound from which elemental tellurium can be obtained upon excitation is included in the lamp fill in an amount which is sufficient so that when the fill is excited with sufficient power in operation, it emits visible radiation, with substantially all of the radiation resulting from the elemental tellurium being provided at wavelengths which are in excess of about 400 nm.

Tellurium compounds which may be used in the unexcited fill include TeO, TeS, TeSe, and tellurium halides including $TeCl_5$, $TeBr_5$ and $TeI_5$. Additional tellurium compounds which may be used are those which have a sufficiently low vapor pressure at room temperature, i.e., are a solid or a liquid, and which have a sufficiently high vapor pressure at operating temperature to provide useful illumination.

In order to provide enough tellurium containing substance to result in a lamp output in which the visible radiation emitted exceeds the ultraviolet, the average number density over the volume of the envelope of the tellurium is preferably at least about $10^{17}$ molecules/cc. That is, if elemental tellurium is used, this refers to the number density of the elemental tellurium, while if a tellurium compound is used, it refers to the number density of the compound.

The microwave or R.F. powered lamps described herein may be operated at a variety of power densities, for example those between about 5 watts/cc and a thousand or more watts/co, it being understood that the power must be sufficient to vaporize the tellurium fill and create a pressure which results in the emission of radiation therefrom, substantially all of which is in excess of about 400 nm. The particular power density which is used in any application will depend upon the amount of tellurium fill used, the size of the bulb, and the required lumen output of the lamp.

Lamps for providing visible radiation which utilize sulfur and/or selenium based fills are known, and are described in U.S. application Ser. No. 071,027, filed Jun. 3, 1993 and PCT Publication No. WO 92/08240, which are incorporated herein by reference. It has been found, in accordance with an aspect of the present invention, that a beneficial effect is provided if tellurium is added to the fill of such a lamp.

More specifically, the addition of tellurium has the effect of shifting the spectral output of the lamp towards the red region, thus providing light which appears warmer to the eye, and which has a better color rendition.

In general, the ratio of the number density of the tellurium to the number density of the sulfur or selenium should not exceed 10%, while at the lower end, the ratio may be as small as a fraction of a percent. The tellurium may be added to the fill either in the form of elemental tellurium, or as a tellurium compound.

Additionally, the spectral output of a lamp in accordance with the invention may be controlled by combining tellurium, sulfur, and/or selenium in the fill in varying amounts.

The lamp fills described herein typically include a starting gas such as argon, xenon, or krypton. Also, the fills may include a variety of additives for various reasons, e.g., metal halides or other substances to emphasize particular regions of the spectrum. Additionally, while the lamp of the invention is capable of operating without mercury in the fill, the addition of mercury, in those applications where it can be tolerated, may enhance efficiency.

Figure 3:
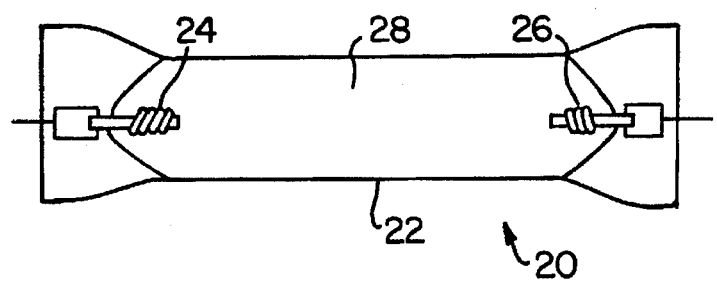
FIG. 3 is a further embodiment of the invention.

A further embodiment of the invention is shown in FIG. 3. This is an arc lamp 20 which is comprised of quartz envelope 22 having electrodes 24 and 26, and containing fill 28. To excite the fill, an A.C. voltage is impressed across the electrodes, whereupon an arc discharge occurs therebetween.

The fill in envelope 22 is as described hereinabove for the electrodeless lamp embodiments, while the lamp may typically be excited at normal power densities for metal halide arc lamps. The electrodes 22 and 24 may be made of or plated with a special material such as platinum to prevent or minimize chemical reactions with the fill gas.

EXAMPLE I

An actual lamp was built in accordance with the invention as follows. A 40 mm outer diameter (OD) (37 mm ID) spherical envelope was filled with 20 mg of Te and 100 Torr Xe, and powered by 1100 watts of microwave power in a resonant cavity. The spectral output of the emitted light is shown in FIG. 4, and is seen to be a continuous, molecular spectrum, which results in light having a pleasant quality. The lamp efficacy was about 105 lumens/watt.

EXAMPLE II

A spherical envelope of 40 mm OD (37 mm ID) was dosed with 35 mg of Se, 5 mg of Te, and 100 torr of Xe. The lamp was excited with 1000 watts of microwave power in a resonant cavity. The spectral output is depicted in FIG. 5. The efficacy is about 175 watts/cc.

COMPARISON (EXAMPLE II)

A spherical envelope of 40 mm OD (37 ID) was dosed With 34 mg of Se.,and 300 torr of Xe and excited with 1000 watts of microwave power in a resonant cavity. The spectral output is depicted in FIG. 6.

A comparison of the spectra depicted in FIGS. 5 and 6 reveals that the spectrum of FIG. 5, which was produced by a selenium lamp with tellurium added is shifted significantly towards the red region as compared with the spectrum of FIG. 6, which was produced with a lamp having a selenium only fill. The light emitted by the lamp of FIG. 5 has a warmer quality, and provides improved color rendition.

It is noted that the abcissas of the graphs of FIGS. 4, 5, and 6 are wavelength in nanometers (nm), while the ordinates are intensity in arbitrary units.

There thus have been disclosed improved lamps in accordance with the present invention. While the invention has been described in connection with preferred and illustrative embodiments, variations will occur to those skilled in the art, and it is therefore understood that the invention herein is defined in the claims which are appended hereto, as well as equivalents.

I claim:

1. A lamp bulb for providing visible radiation, comprising, an envelope of light transmissive material, and a fill in said envelope which includes a tellurium containing substance from which elemental tellurium can be obtained upon excitation, which is present in an amount such that when the fill is excited with sufficient power in operation, the excited fill emits visible radiation with substantially all of the radiation resulting from the elemental tellurium being molecular radiation which is emitted at wavelengths longer than about 400 nm.

2. The light bulb of claim 1 in combination with:

means for exciting said fill with sufficient power to cause it to produce said visible radiation and said radiation substantially all of which is emitted at wavelengths longer then about 400 nm.

3. The apparatus of claim 2 wherein said fill further includes a starting gas.

4. The apparatus of claim 2 wherein the spectrum of said radiation substantially all of which is in excess of 400 nm, is continuous.

5. The apparatus of claim 2 wherein the light bulb is electrodeless, and said means for exciting applies microwave or r.f. power to the fill.

6. The apparatus of claim 2 wherein the number density of the tellurium containing substance is at least $10^{17}$ molecules/cc.

7. The apparatus of claim 2 wherein said visible radiation is primarily produced by said elemental tellurium.

8. The apparatus of claim 2 wherein said light bulb contains electrodes.

9. The apparatus of claim 2 wherein the fill further includes an additive for emphasizing a particular spectral region.

10. The apparatus of claim 2 wherein said fill further includes sulfur which can be obtained upon excitation, for producing visible radiation.

11. The apparatus of claim 10 wherein the relative amounts of tellurium and sulfur in said bulb upon excitation are such that the visible radiation which is emitted from said bulb is primarily from said sulfur.

12. The apparatus of claim 2 wherein said fill further includes selenium which can be obtained upon excitation, for producing visible radiation.

13. The apparatus of claim 12 wherein the relative amounts of tellurium and selenium in said bulb upon excitation are such that the visible radiation which is emitted from said bulb is primarily from said selenium.

14. An electrodeless lamp bulb for providing visible radiation, comprising, an envelope of light transmissive material, and a fill in said envelope which includes a tellurium containing substance from which elemental tellurium can be obtained upon excitation, which is present in an amount such that when the fill is excited with sufficient microwave or r.f. power in operation, the excited fill emits visible radiation primarily from the elemental tellurium, with substantially all of the radiation from the elemental tellurium being molecular radiation which is emitted at wavelengths longer than about 400 nm.

* * * * *